US008577320B2

(12) United States Patent
Quinsat et al.

(10) Patent No.: US 8,577,320 B2
(45) Date of Patent: Nov. 5, 2013

(54) OSCILLATION DETECTOR

(75) Inventors: Michaël Quinsat, Grenoble (FR);
Marie-Claire Cyrille, Sinard (FR);
Ursula Ebels, Grenoble (FR);
Jean-Philippe Michel, Fontaine (FR);
Michaël Pelissier, Grenoble (FR);
Patrick Villard, La Tronche (FR);
Mykhailo Zarudniev, Kiev (UA)

(73) Assignee: Commissariat a l'energie et aux energies alternatives, Paris (FR)

( * ) Notice: Subject to any disclaimer, the term of this patent is extended or adjusted under 35 U.S.C. 154(b) by 23 days.

(21) Appl. No.: 13/450,994

(22) Filed: Apr. 19, 2012

(65) Prior Publication Data
US 2012/0268172 A1  Oct. 25, 2012

(30) Foreign Application Priority Data
Apr. 20, 2011  (FR) ..................... 11 53424

(51) Int. Cl.
*H04B 1/06*  (2006.01)
(52) U.S. Cl.
USPC ................... 455/255; 331/177 R
(58) Field of Classification Search
USPC ................... 455/255; 331/177 R
See application file for complete search history.

(56) References Cited

U.S. PATENT DOCUMENTS

| | | | |
|---|---|---|---|
| 5,695,864 A | 12/1997 | Slonczewski | |
| 5,956,197 A * | 9/1999 | Le et al. ................ | 360/67 |
| 2003/0193325 A1 | 10/2003 | Koziel | |
| 2008/0150643 A1 | 6/2008 | Suzuki et al. | |
| 2013/0057356 A1 * | 3/2013 | Houssameddine et al. ................ | 331/177 R |
| 2013/0057357 A1 * | 3/2013 | Houssameddine et al. ................ | 331/177 R |

FOREIGN PATENT DOCUMENTS

| | | |
|---|---|---|
| EP | 2 892 871 | 5/2007 |
| EP | 1 860 769 | 11/2007 |
| FR | 2817998 | 6/2002 |
| FR | 957888 | 11/2009 |

OTHER PUBLICATIONS

Baibich, M., Broto, J.M., Fert, A., Nguyen Van Dau, F., Petroff, F., Etienne, P., Creuzet, G., Friederch, A. and Chazelas, J., "*Giant magnetoresistance of (001)Fe/(001)Cr magnetic superlattices*", Phys.Rev.Lett., 61 (1988) 2472.
Katine, J.A., Albert, F.J., Buhrman, R.A., Myers, E.B., and Ralph, D.C., "*Current-Driven Magnetization Reversal and Spin-Wave Excitations in Co /Cu /Co Pillars*", Phys.Rev.Lett. 84, 3149 (2000).
Kiselev, S.I., Sankey, J.C., Krivorotov, I.N., Emley, N.C., Schoelkopf, R.J., Buhrman, R.A., and Ralph, D.C., "*Microwave oscillations of a nanomagnet driven by a spin-polarized current*", Nture, 425, 380 (2003)).
Moodera, JS., Kinder, LR., Wong, TM. and Meservey,R. "*Large magnetoresistance at room temperature in ferromagnetic thin film tunnel junctions*", Phys.Rev.Lett 74 , (1995) 3273-6.
Slavin and V. Tiberkevich, "*Nonlinear auto-oscillator theory of microwave generation by spin-polarized current*" IEEE Transaction on Magnetics, vol. n° 45, pp. 1875-1918(2009).
Zarudniev M and al: "Spin torque oscillator characteristics in coupled networks", Hardware and Software Implementation and Control of Distributed MEMS (DMEMS), 2010 First workshop on, IEEE, Piscataway, NJ, USA, Jun. 28, 2010, pp. 23-23.

* cited by examiner

*Primary Examiner* — Creighton Smith
(74) *Attorney, Agent, or Firm* — Occhiuti & Rohlicek LLP

(57) ABSTRACT

An oscillation detector having an RF oscillator configured to be synchronized with a first frequency and a comparator for distinguishing the synchronized state from the non-synchronized state of the radiofrequency oscillator on the basis of an oscillating signal produced by the radiofrequency oscillator and indicating the presence of oscillations in a frequency band around the first frequency in response to identifying the synchronized state and, in alternation, indicating the absence of oscillations in this frequency band otherwise.

10 Claims, 3 Drawing Sheets

OSCILLATION DETECTOR

RELATED APPLICATIONS

Under 35 USC 119, this application claims the benefit of the priority date of French Patent Application 1153424, filed Apr. 20, 2011, the contents of which are herein incorporated by reference.

BACKGROUND OF THE INVENTION

An object of the invention is a detector and a method for detecting oscillations, within a frequency band around a frequency $f_t$, in a received radiofrequency electrical signal e(t).

There are many situations where it is useful to know whether oscillations within a frequency band around a given frequency $f_t$ are present in a radiofrequency signal. Indeed, the presence or absence of oscillations within this frequency band can encode a piece of information. To decode this information, it is necessary therefore to be capable of detecting the presence or absence of oscillations within this frequency band. For example, oscillation detectors are used in fields as varied as:
 telecommunications,
 motor control and command,
 the protection of electrical lines, and
 proximity detectors.

Classically, oscillation detectors are made of electrical components such as capacitors, resistors and the like. For one example of an embodiment of a known oscillation detector, reference may be made to the patent application US2003193325.

All these known detectors have an acquisition terminal at which the signal e(t) is received.

All these known detectors have the common feature of being bulky and often complicated.

The prior art is also known from:
 US2008/150643, and
 Zarudniev M and al: "Spin torque oscillator characteristics in coupled networks", Hardware and Software Implementation and Control of Distributed MEMS (DMEMS), 2010 First workshop on, IEEE, Piscataway, N.J., USA, 28 Jun. 2010, pages 23-23.

SUMMARY OF THE INVENTION

The invention seeks to overcome this drawback by proposing a more compact detector.

An object of the invention therefore is a detector according to claim 1.

The above detector uses chiefly a magnetoresistive device, the output electrode of which is connected to a comparator capable of distinguishing the synchronized state from the non-synchronized state of the magnetoresistive device. Magnetoresistive devices are particularly compact. Indeed, they generally have a cross-section smaller than 10 m² and a thickness of a few micrometers (smaller than 10 μm). Thus, through the use of the magnetoresistive device in the above detector, the space requirement of the detector is reduced.

The embodiments of this detector may include one or more of the characteristics of the dependent claims.

These embodiments of the detector furthermore have the following advantages:
 using the power of the low-frequency components to distinguish the synchronized state from the non-synchronized state enables the detector to be made in a simple way, and
 using several radiofrequency oscillators parallel-connected between the common input and output terminals makes it possible to amplify the amplitude of the oscillating signal and therefore to increase the sensitivity of the detector.

An object of the invention is also a method for detecting oscillations according to claim 7.

The embodiments of this method may include one or more of the characteristics of the dependent method claims.

BRIEF DESCRIPTION OF THE DRAWINGS

The invention will be understood more clearly from the following description, given purely by way of a non-restrictive example and made with reference to the drawings of which.

In these figures, the same references are used to designate the same elements.

MORE DETAILED DESCRIPTION

Here below in this description, the characteristics and functions well known to those skilled in the art shall not be described in detail.

Figure 1:
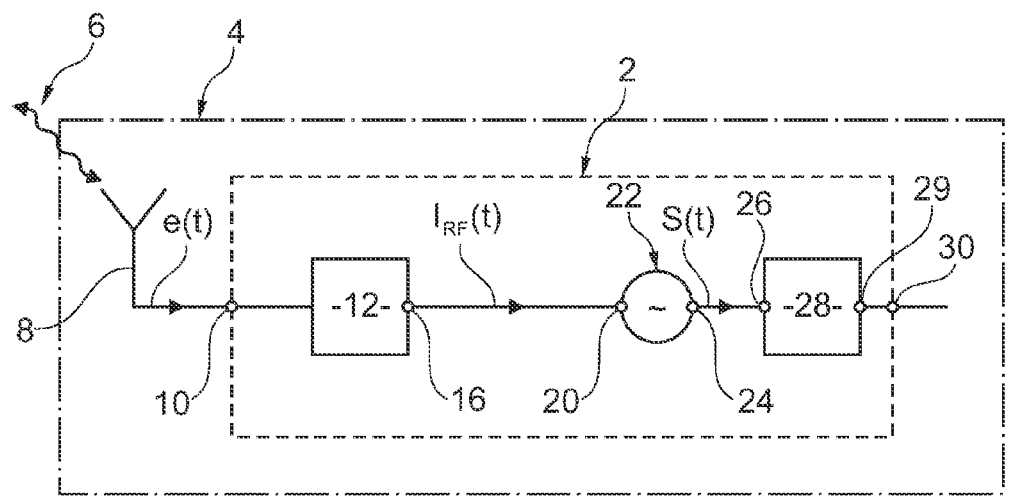
FIG. 1 is a schematic illustration of a detector of oscillations at the frequency $f_t$.

FIG. 1 shows a detector 2 of oscillations within a frequency band around the frequency $f_t$ in an electrical signal e(t). For example, the frequency band is centered on the frequency $f_t$. The signal e(t) is an electrical current. Here, the detector 2 is described in the particular case where it is part of an apparatus 4 capable of receiving the electrical signal through a wireless link 6. For example, the apparatus 4 is a portable telephone and the link 6 is a radio link.

The apparatus 4 is equipped with an antenna 8 to set up the wireless link 6. The antenna 8 converts the radio signal into an electrical signal e(t) which is transmitted to an acquisition terminal 10 for acquiring the electrical signal of the detector 2. Between the antenna 8 and the terminal 10, the apparatus 4 may include different electronic blocks which have not been shown in order to simplify FIG. 1.

The detector 2 has a block 12 for shaping the electrical signal e(t). This block 12 sets the amplitude of the signal e(t). To this end, it has especially an amplifier. Here, the block 12 is also used to improve the signal-to-noise ratio of the received signal.

Figure 2:
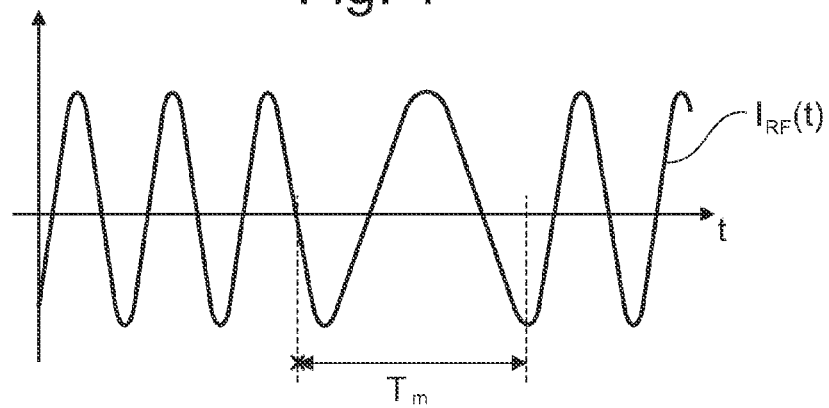
FIG. 2 is a partial timing diagram of the signal comprising oscillations at the frequency $f_t$.

The shaped signal generated by the block 12 is rendered at an output 16. This signal is an electrical current denoted as $I_{RF}(t)$. This signal $I_{RF}(t)$ is represented as a function of the time t on the timing diagram of FIG. 2.

In this example, this signal $I_{RF}(t)$ oscillates at a frequency $f_t$ for a duration $T_m$. Before and after the duration $T_m$, the signal $I_{RF}(t)$ oscillates at other frequencies which are not included in the frequency band centered on the frequency $f_t$. Typically, the frequency $f_t$ is a radio frequency, i.e. a frequency ranging from 100 MHz to 60 or 120 GHz, and preferably ranging from 700 MHz to 40 GHz. Typically, the frequency band centered on the frequency $f_t$ has a width of several MHz. For example, it is more than 50 MHz wide.

Advantageously, whatever the oscillation frequency, the amplitude of the signal $I_{RF}(t)$ is substantially constant. The term "substantially constant" designates the fact that the amplitudes of the oscillations for two successive unspecified durations $T_m$ are equal to each other to within ±5% and preferably each other to within ±1%.

The quality factor of the oscillations on the duration $T_m$ is good. The term quality factor herein designates the following ratio:

$$Q=f_t/\Delta f$$

where:
Q is the quality factor,
$\Delta f_t$ is the frequency of the oscillations, and
$\Delta f$ is the width at mid-height of the line centered on the frequency $f_t$ in the frequency spectrum of these oscillations.

A quality factor is considered to be good if it is greater than 1000 or even 10000.

The output 16 is directly connected to a synchronization terminal 20 of a radiofrequency oscillator 22. This oscillator 22 produces an oscillating signal s(t) at an output electrode 24. This oscillating signal is also known as a "wave". The electrode 24 is directly connected to the input 26 of a comparator 28. One output 29 of this comparator is directly connected to a rendering terminal 30 at which the detector 2 indicates the presence or absence of oscillations at the frequency $f_t$.

The comparator 28 is capable of distinguishing or discriminating a synchronized state from a non-synchronized state of the radiofrequency oscillator 22 on the basis of the signal s(t). One possible embodiment of this comparator 28 is described in greater detail with reference to FIGS. 6 and 7.

Figure 3:
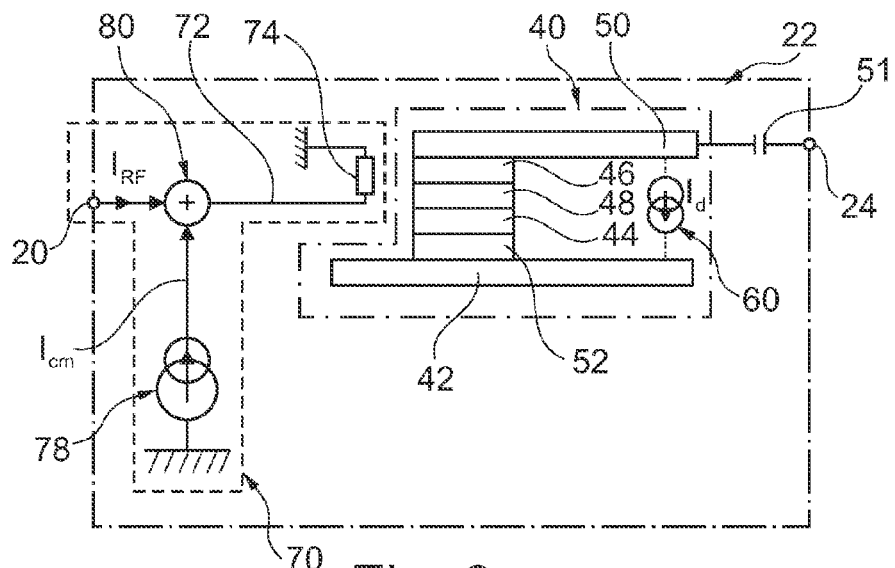
FIG. 3 is a schematic illustration of a radiofrequency oscillator used in the detector of FIG. 1.

FIG. 3 gives a more detailed view of an example of an embodiment of the oscillator 22. This oscillator 22 is derived from spin electronics.

Spin electronics uses the spin of electrons as an additional degree of freedom in order to generate novel effects. The spin polarization of an electrical current results from the asymmetry existing between the spin-up type polarization of the conduction electrons (i.e. polarization parallel to the local magnetization) and the spin-down type polarization (i.e. scattering anti-parallel to the local magnetization). This asymmetry leads to an asymmetry in the conductivity between the two channels, namely the spin-up and spin-down channels, giving rise to a distinct spin polarization of the electrical current.

This spin polarization of the current is the source of magnetoresistive phenomena in magnetic multilayers such as giant magnetoresistance (Baibich, M., Broto, J. M., Fert, A., Nguyen Van Dau, F., Petroff, F., Etienne, P., Creuzet, G., Friederch, A. and Chazelas, J., "*Giant magnetoresistance of (001)Fe/(001)Cr magnetic superlattices*", Phys.Rev.Lett., 61 (1988) 2472), or tunnel magnetoresistance (Moodera, J S., Kinder, L R., Wong, T M. and Meservey, R. "*Large magnetoresistance at room temperature in ferromagnetic thin film tunnel junctions*", Phys.Rev.Lett 74, (1995) 3273-6).

Furthermore, it has also been observed that, by making a spin-polarized current cross a thin magnetic layer, it is possible to induce a reversal of its magnetization when there is no external magnetic field (Katine, J. A., Albert, F. J., Buhrman, R. A., Myers, E. B., and Ralph, D. C., "*Current-Driven Magnetization Reversal and Spin-Wave Excitations in Co/Cu/Co Pillars*", Phys.Rev.Lett. 84, 3149 (2000)).

Polarized current can also generate sustained magnetic excitations, also known as oscillations (Kiselev, S. I., Sankey, J. C., Krivorotov, L N., Emley, N. C., Schoelkopf, R. J., Buhrman, R. A., and Ralph, D. C., "*Microwave oscillations of a nanomagnet driven by a spin-polarized current*", Nature, 425, 380 (2003)). The use of the effect of the generation of sustained magnetic excitations in a magnetoresistive device makes it possible to convert this effect into a modulation of electrical resistance directly usable in electronic circuits. The patent applications U.S. Pat. No. 5,695,864 and EP1 860 769 describe various developments implementing the physical principle mentioned here above. They describe especially the precession of the magnetization of a magnetic layer crossed by a spin-polarized electrical current. The physical principles implemented as well as the terminology used are also described and defined in the patent application FR2 892 871.

The oscillation frequency of these radiofrequency oscillators is adjusted by playing on the intensity of the current that goes through them and additionally, if necessary, on an external magnetic field.

Since these radiofrequency oscillators are known, only the elements needed for an understanding of the working of the demodulator 2 are described in greater detail.

The oscillator 22 comprises a magnetoresistive device 40. This device 40 is formed by a stack of magnetic and non-magnetic layers. This stack may form:
a tunnel junction also known as a TMR (tunnel magnetoresistance) junction, or
a spin valve also known as GMR (giant magnetoresistance) spin valve.

Here, the device 40 is described in the particular case where the stack forms a tunnel junction. To this end, the stack comprises at least the following layers:
an input electrode 42 into which there is injected a direct electrical current $I_d$,
a magnetic layer 44 called a "reference layer" that is capable of spin-polarizing the electrical current injected into the electrode 42, and the magnetization of which has a fixed direction,
a magnetic layer 46, called a "free layer", the magnetization of which can oscillate when it is crossed by the spin-polarized current,
a non-magnetic layer 48, called a spacer, interposed between the two preceding layers to create the tunnel junction, and
an output electrode 50 at which the oscillating signal s(t) is produced.

To produce a high current density, the cross-section of at least one of the layers of the stack typically has a diameter of less than 300 nm and preferably less than 200 or 100 nm. When the cross-section is not a disk, the term "diameter" must be understood to mean "hydraulic diameter". Typically, the term "high" current density designates a current density greater than $10^6$ A/cm$^2$ or $10^7$ A/cm$^2$.

This magnetoresistive device 40 is conformated according to a geometry known as CPP (current perpendicular to plane) geometry. More specifically, in FIG. 2, the magnetoresistive device adopts a structure known as the "nanopillar" structure. In this structure, the layers between the electrodes 42 and 50 have the same horizontal section.

The width L of the different layers forming the pillar is constant. Here, the width L typically ranges from 20 nm to 200 nm.

The electrodes 42 and 50 make it possible to convey the current that crosses the different layers forming the magnetic device perpendicularly to the plane of these layers. The electrode 50 is connected to the electrode 54 by means of a capacitor 51.

The layers 44, 46 and 48 are laid out and conformated so as to enable the appearance of the magnetoresistive properties, i.e. a variation of the resistance of the pillar as a function of the directions of magnetization of the layers 44 and 46.

To improve the readability of FIG. 1, the proportions between the thicknesses of the different layers have not been maintained.

The reference layer 44 is made out of an electrically conductive magnetic material. Its upper face is in direct contact with the spacer 48. It has a direction of easier magnetization contained in the plane of the layer.

The reference layer 44 has the function of spin-polarizing the electrons of the current that cross it. It therefore has a sufficient thickness to achieve this function.

For example, the reference layer 44 is made out of cobalt (Co), nickel (Ni), iron (Fe) and their alloys (CoFe, NiFe, CoFeB ... etc.). The thickness of the reference layer 44 is of the order of a few nanometers. The reference layer 44 may be laminated by the insertion of a few (typically 2 to 4) very thin layers of copper, silver or gold with a thickness of about 0.2 to 0.5 nm to reduce the spin diffusion length.

Here, the reference layer 44 has a magnetization of fixed direction. The term "magnetization of fixed direction" designates the fact that the direction of the magnetic moment of the reference layer 44 is more difficult to modify than the direction of the magnetic moment of the free layer 46. To obtain this here, the magnetization of the reference layer 44 is trapped by a conductive, anti-ferromagnetic layer 52 interposed between the reference layer 44 and the electrode 42. The upper face of the layer 52 is in direct contact with the lower face of the reference layer 44.

Typically, the thickness of the layer 52 ranges from 5 to 50 nm. It can be made out of a manganese alloy such as one of the following alloys IrMn, PtMn, FeMn, etc. For example, this layer 52 is made out of a material chosen from the group comprising IrMn, FeMn, PtMn, NiMn.

The spacer 48 has a non-magnetic layer. This spacer 48 is thin enough to enable the spin-polarized current to pass from the reference layer 44 to the free layer 46 in limiting polarization loss. Conversely, the thickness of this spacer 48 is great enough to provide for magnetic uncoupling between the layers 44 and 46.

The spacer 48 is made out of an insulating material such as an aluminum oxide or aluminum nitrite, a magnesium oxide, a tantalum nitrite, strontium titanate ($SrTiO_3$), etc. The pillar then has tunnel magnetoresistive or TMR properties and the spacer 48 forms a tunnel barrier. In this case, the thickness of the spacer 48 typically ranges from 0.5 nm to 3 nm.

Here, the tunnel barrier of the device 40 is thin in order to have a low RA factor, i.e. a factor ranging from 0.1 to 20$\Omega\mu m^2$, and advantageously below 10 or even 5 $\Omega\mu m^2$. The RA factor of a tunnel barrier is the product of the resistance of the tunnel barrier multiplied by its area. Here, the area is the surface area of the cross-section of the tunnel barrier.

Generally, the higher the RA factor of the tunnel barrier, the greater will be the range of variation of the resistivity of the tunnel junction (for example it will be greater than 10%) and the higher will be the sensitivity of the tunnel junction to the precession of the magnetization in the free layer. Typically, for RA factor values of this order, it is generally easy to generate oscillations and it is possible to obtain TMR values ranging from 20% to 150% of the RA factor (typically 80% of the RA factor for an RA factor of 1 $\Omega\mu m^2$), making it possible to obtain high sensitivity of the tunnel junction to precession of the magnetization in the free layer.

The free layer 46 is an electrically conductive magnetic layer, the magnetization of which can rotate or "precess" more easily than the magnetization of the reference layer 44.

Many embodiments of the free layer are possible. For example, possible embodiments of this free layer are described in the patent application filed under number FR 0 957 888 and in the patent application published under number FR2 892 871.

The lower face of the layer 46 is in direct contact with the upper face of the spacer 48. The upper face for its part is in direct contact with the electrode 50. This layer 46 is made for example out of a ferromagnetic material such as cobalt, nickel or iron or an alloy of these different metals (for example CoFe, CoFeB, NiFe, etc.).

In the absence of spin-polarized current and of any external magnetic field, the direction M of the total magnetic moment of the layer 46 is oriented in parallel to the plane of this layer. The direction M then corresponds to the direction of easiest magnetization of the free layer.

Typically, this stack of layers is made on the upper face of a substrate not shown herein.

The device 40 works as a spin transfer oscillator or STO when the intensity of the spin-polarized direct current $I_d$ crosses a threshold $I_c$ known as a "critical current of oscillations". When the intensity of the current $I_d$ crosses this threshold $I_c$ the magnetization of the free layer of the device 40 processes sustainedly. The signal s(t) then oscillates at the free frequency $f_{lo}$. Typically, the threshold $I_c$ corresponds to a current density greater than $10^7$ A/cm$^2$ in the cross-section of the layers of the stack. If not, the device 40 behaves like a resonator also known as an STR (spin transfer resonator), and the oscillating signal generated is dampened and not sustained. However, even in this case, to generate the dampened oscillating signal, the current density in the cross-section of the layers of the stack must be high.

To generate the direct current $I_d$, the oscillator 22 has a direct current source 60. In this embodiment, the source 60 generates a direct current $I_d$ the intensity of which is above the threshold $I_c$.

To set the free frequency $f_{lo}$ of oscillation of the signal s(t) generated by the device 40, here the oscillator 22 is also equipped with a generator 70 of a continuous or constant magnetic field $H_b$. This generator 70 is laid out relatively to the device 40 in such a way that these lines of the magnetic field $H_b$ cross the free layer 46. For example, this generator 70 takes the form of a conductive track 72 powered with direct current $I_{cm}$ by a current source 78. The track 72 is placed in proximity to the stack of the layers of the device 40. For example, this track 72 is laid out relatively to the layer 46 so that the magnetic field lines generated are parallel to the direction M of easiest magnetization of the layer 46. Preferably, to limit the electrical consumption of the generator 70, the shortest distance between this conductive track 72 and the free layer 46 is smaller than 100 μm and advantageously smaller than 10 μm or even 1 m. In FIG. 3, the resistivity of this track 72 is represented by a resistor 74. For example, the resistance value 74 is equal to 10Ω and corresponds to the resistance of the conductive track 72 between the output of the source 78 and a reference potential such as ground.

The generator 70 has a summing element 80, one input of which is directly connected to the synchronization terminal 20 and the other input of which is directly connected to the output of the source 78 of the direct current $I_{cm}$. The output of this summing element 80 is directly connected to the track 72.

This enables the generation, in addition to the magnetic field $H_b$, of an alternating magnetic field $H_a$, the frequency of which is equal to that of the signal $I_{RF}(t)$.

The oscillation signal of the oscillator 22 is denoted as $f_{lo}$. When there is no signal at the terminal 20, this frequency $f_o$ is equal to the free frequency $f_{lo}$ of oscillation of the oscillator 22. The free frequency is a function of the field $H_b$ and of the intensity of the current $I_d$. When an oscillating signal is received at the terminal 20, the oscillator 22 can get synchronized with this oscillating signal. When the oscillator 22 is synchronized, it produces an oscillating signal s(t) which oscillates in phase with the signal received at the terminal 20. Furthermore, when it is synchronized, the frequency $f_0$ of the signal s(t) produced at the electrode 50 becomes equal to $\alpha f_t$, where:

$f_t$ is the frequency of the signal received at the terminal 20, and $\alpha$ is a rational number written in the form of a fraction M/P, where M and P are non-zero positive integers.

M can be a natural integer greater than or smaller than P. M and P can also be equal. P can be equal to one.

At this stage, it will be noted that not all the values of $\alpha$ are possible. In reality, only certain particular values of $\alpha$ are possible. On this subject, the following article may be referred to: Sergei Urazhdin and Phillip Tabor, "*Fractional synchronization of spin-torque nano-oscillators*", Physical Review Letters, PRL 105, 104101, 3 Sep. 2010.

The possible values of $\alpha$ are for example determined experimentally by causing the free frequency $f_{lo}$ to vary and by injecting, at the terminal 20, a signal of a frequency constantly equal to the frequency $f_t$. To modify the free frequency $f_{lo}$, it is possible to modify the intensity of the magnetic field $H_b$ and/or the intensity of the current $I_d$. This therefore amounts here to modifying the intensity of the current $I_d$ and/or the intensity of the current $I_{cm}$. Indeed, it is known that the free frequency $f_{lo}$ depends on the intensity of the magnetic field $H_b$ which crosses the free layer and the intensity of the direct current $I_d$. For example, the free frequency $f_{lo}$ can be estimated by means of the following relationship:

$$\omega(H_b, I_d) = \omega_o(H_b) + N p(I_d) \quad (1),$$

where:

$\omega(H_b, I_d)$ is the pulsation of the free frequency $f_{lo}$, i.e. $2\pi f_{lo}$.

$\omega_o(H_b)$ is the pulsation of the oscillator 22 caused by the magnetic field $H_b$, N is an experimentally determinable constant, and $p(I_d)$ is the amplitude of the oscillations of the signal s(t) as a function of the intensity of the current $I_d$.

The pulsation $\omega_o(H_b)$ can be given by Kittel's law. For example, when the magnetic field $H_b$ generated by the generator 70 is parallel to the axis of easiest magnetization of the free layer 46, then the pulsation $\omega_o(H_b)$ is given by the following relationship:

$$\omega_o(H_b) = (\gamma_o/2\pi)(H_b(H_b + 4\pi M_s))^{1/2} \quad (2),$$

where:

$\gamma_o$ is equal to about 2.82 MHz/Oe, $\pi$ is the symbol for "pi" radians, and $4\pi M_s$ is the magnetization at saturation (about 16.000 Oe for a layer made of CoFeB).

The unit "Oe" is an oersted ($=10^3/(4\pi)$ A/m or about 80 A/m).

For example, by causing the intensity of the field $H_b$ to vary from 1 Oe to 5 kOe, the free frequency $f_{lo}$ is made to vary from 356 MHz to 29 GHz. Preferably, here, the field $H_b$ is made to vary from 50 Oe to 1.2 kOe, which corresponds to a variation of the free frequency $f_{lo}$ of 2 GHz to 13 GHz. In the case of the generator 70, the intensity of the magnetic field $H_b$ is modified by causing the intensity of the current $I_{cm}$ to vary.

The relationship (1), N is a constant in hertz which is proper to the magnetoresistive device 40. It can be determined experimentally. For example, the evolution of the free frequency $f_{lo}$ as a function of the intensity of the current $I_d$ for oscillations of the magnetization of the free layer in its plane is measured. From these measurements, the constant N can be computed. Typically, it is of the order of some GHz. For example, here $N/2\pi = 7.5$ GHz.

If the oscillations of the magnetization of the free layer are not included in its plane, the constant $N/2\pi$ is typically greater than 20 GHz.

Further explanations on the relationships linking the free frequency $f_{lo}$ to the different parameters of the magnetoresistive device can be found in the following article: A. Slavin and V. Tiberkevich, "*Nonlinear auto-oscillator theory of microwave generation by spin-polarized current*" IEEE Transaction on Magnetics, vol no 45, pp. 1875-1918 (2009).

When the oscillator 22 is synchronized, the low-frequency noise, i.e. the power of the oscillations at frequencies below 1 GHz and preferably below a 100 Hz is very small. The term "very small" herein indicates the fact that the power of the low-frequency noise is at least ten times smaller, and preferably 30 times smaller, than the power of the low-frequency noise measurable when there is no synchronization, i.e. when no signal is received at the terminal 20.

Furthermore, when the oscillator 22 is synchronized, then the quality factor of the oscillator 22 is better than when there is no synchronization. Typically, the quality factor of the oscillator 22 is 100 times or 1,000 times, or even $10^6$ times greater when it is synchronized than its quality factor when no signal is received through the terminal 20.

Figure 4:
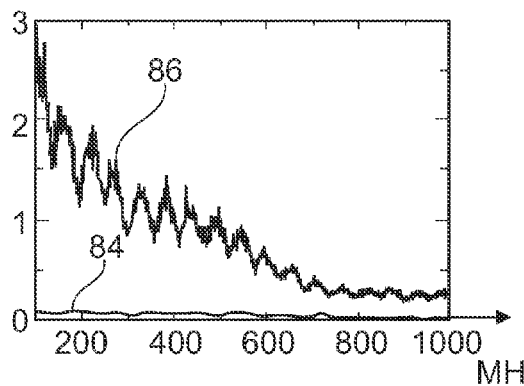
FIGS. 4 to 5 are respective parts of a frequency spectrum illustrating different aspects of the oscillating signal produced by the radiofrequency oscillator of FIG. 3.
Figure 5:
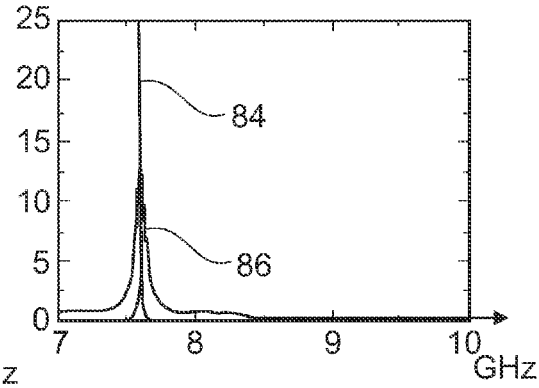

These phenomena are illustrated on the graphs of FIGS. 4 and 5. These graphs have been obtained by simulation in the particular case where the free frequency of the oscillator 22 is 7.6 GHz.

The graphs of FIGS. 4 and 5 respectively represent parts of the power spectrum of the signal s(t) when the signal $I_{RF}(t)$ includes oscillations of frequency 15.2 GHz (curve 84) and then oscillations of frequency 15.7 GHz (curve 86). The oscillator 22 gets synchronized with the 15.2 GHz oscillations because they are equal to twice its free frequency. However, it does not get synchronized with the 15.7 GHz oscillations.

The graph of FIG. 4 represents the power spectrum for frequencies below 1 GHz. As illustrated by this graph, the power of the low-frequency noise is negligible when the oscillator 22 is synchronized as compared with the power of this same low-frequency noise when there is no synchronization of the oscillator.

The graph of FIG. 5 represents the power spectrum for frequencies ranging from 7 to 10 GHz. Whether synchronized or not, the oscillator 22 always oscillates around its free frequency. However, as illustrated in this graph, the quality factor of the oscillator 22 is far better when it is synchronized than when it is not.

The above information can therefore be used to determine several possible values of $\alpha$. Here below in the description, the values of $\alpha$ are only those for which a synchronization is possible. It will also be noted that the value $\alpha = 1$ is always possible. Thus, if it is desired solely that the synchronized oscillator 22 should oscillate at the frequency $f_t$, then it is not necessary to determine the different possible values for $\alpha$.

Here, the working conditions of the oscillator 22 are set so that it can get synchronized with the oscillations of frequency $f_t$ in the signal $I_{RF}(t)$. The working conditions are defined as being the values of the intensity of the current $I_d$ and of the field $H_b$.

In this embodiment, it is desired that, when the oscillator 22 is synchronized with the frequency $f_t$, it oscillates at the frequency $\alpha f_t$. By way of an illustration, $\alpha$ is equal to ½; ¾; 1; 3/2; 5/2; 2; 3; 4 or 7/2 or chosen from the group comprising 2; ¾; 3/2; 5/2; 2; 3; 4 and 7/2. Here, $\alpha$ is chosen to be equal to one or strictly smaller than one, for example smaller than 0,8. To this end, the current $I_d$ and the field $H_b$ are set so that the frequency $f_{lo}$ of oscillations is close the frequency $\alpha f_t$. To this end, here, the intensities of the currents $I_d$ and $I_{cm}$ are set so that the free frequency $f_{lo}$ is equal to $\alpha f_t$. The setting is done for example:

- by fixing the intensity of the current $I_d$ just above the threshold $I_c$ then
- by determining by means of the relationship (2), the magnetic field $H_b$ which can be used to obtain free frequency of oscillations equal to $\alpha f_t$, and finally
- by determining the intensity of the current $I_{cm}$ which makes it possible to obtain the field $H_b$ in the free layer 46.

The synchronization takes place for oscillations at the terminal 20 at the frequency $f_t$ but also for oscillations at the terminal 20 at frequencies close to the frequency $f_t$. In other words, the oscillator 22 gets synchronized with all the oscillations whose frequency belongs to a frequency band $[f_t-\delta t; f_t+\delta_t]$. In the present case, the width $2\delta_t$ of this band must be small enough to enable the oscillator 22 to get synchronized only with oscillations close to the frequency $f_t$ and not with oscillations of remote frequencies $f_p$ which are not to be detected. For example, the difference between the frequencies $f_t$ and $f_p$ is at least 100 kHz and preferably at least 100 MHz. The width of this band increases when the intensity of the electrical signal $I_{RF}(t)$ increases. Consequently, here, the amplifier of the block 12 is adjusted so that the difference $\delta_t$ should be small enough for the frequency $f_p$ not to belong to the band $[f_t-\delta_t; f_t+\delta_t]$. For example, the intensity of the signal $I_{RF}(t)$ is amplified until this intensity corresponds to a magnetic field $H_a$ within the free layer 46 at least greater than 1 Oe and preferably greater than 10 Oe. However, the intensity of the signal $I_{RF}(t)$ is kept at a level small enough to maintain the frequency $f_p$ outside the band $[f_t-\delta_t; f_t+\delta_t]$.

Figure 6:
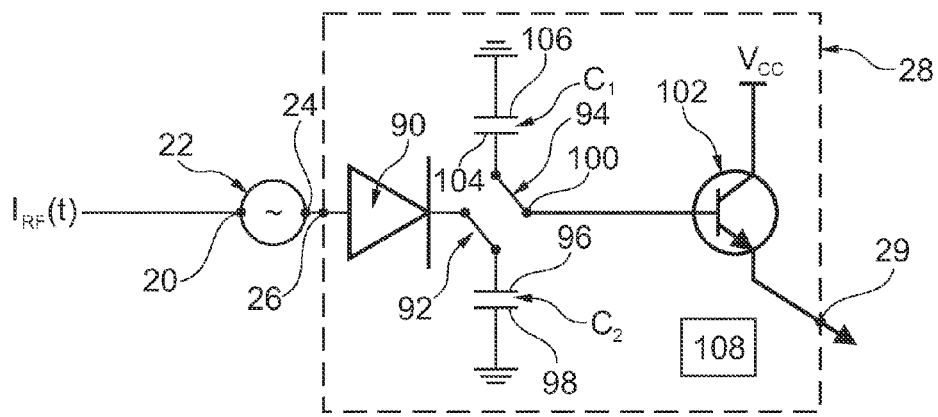
FIGS. 6 and 7 are schematic illustrations of a comparator of the detector of FIG. 1.
Figure 7:
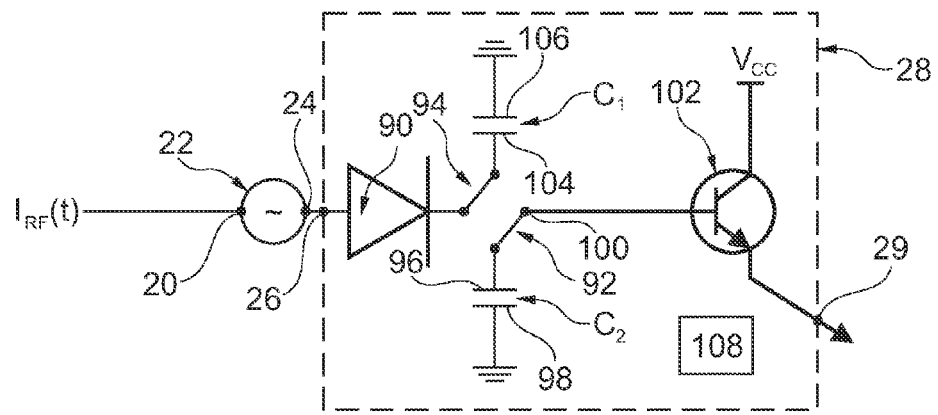

FIGS. 6 and 7 give a more detailed view of a particular embodiment of the comparator 28.

The comparator 28 has a diode 90, the anode of which is directly connected to the terminal 26. The cathode of the diode 90 is connected to a set of two controllable switches 92 and 94.

The switch 92 is permanently connected to an electrode 96 of a capacitor $C_2$. The other electrode 98 of this capacitor $C_2$ is connected to ground. The switch 92 connects the cathode of the diode 90 to the electrode 96 (FIG. 6), and alternately, the electrode 96 to a control terminal 100 of a device 102 for indicating the charge of a capacitor (FIG. 7).

The switch 94 is permanently connected to an electrode 104 of a capacitor $C_1$. The other electrode 106 of this capacitor $C_1$ is connected to ground. The switch 94 connects the cathode of the diode 90 to the electrode 104 (FIG. 7) and alternately the electrode 104 to the control terminal 100 (FIG. 6).

Here, the device 102 is a transistor, the base of which forms the control electrode 100. The collector of this transistor is permanently connected to a DC voltage source $V_{cc}$. The emitter of this transistor is directly connected to the terminal 29.

The comparator 28 also has a clock 108 capable of controlling the switches 92 and 94 so that, in alternation and at regular intervals, they switch between the state shown in FIG. 6 and the state shown in FIG. 7.

Figure 8:
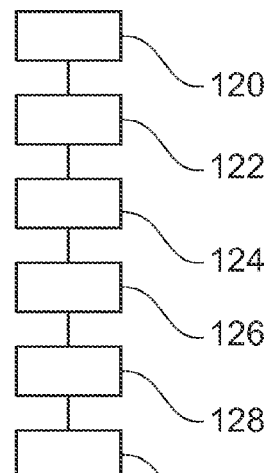
FIG. 8 is a timing diagram of a method of detection by means of the detector of FIG. 1.

The working of the detector 2 shall now be described in greater detail with reference to the method of FIG. 8.

Initially, at a step 120, the intensity of the currents $I_d$ and $I_{cm}$ is adjusted so that the free frequency $f_{lo}$ is equal to $\alpha f_t$. Furthermore, the intensity of the current $I_d$ is chosen to be greater than or equal to the intensity of the critical current $I_c$ so that the magnetoresistive device 40 oscillates.

At a step 122, the block 12 for shaping the signal $I_{RF}(t)$ is set so that the difference $\delta_t$ is small enough in such a way that the frequency or frequencies $f_p$ which are not to be detected do not belong to the band $[f_t-\delta_t; f_t+\delta_t]$.

From this moment onwards, the detector 2 can be used to detect oscillations within the band $[f_t-\delta_t; f_t+\delta_t]$.

More specifically, at a step 124, the clock 108 permanently controls the switch-over of the switches 92 and 94 between the two states shown, respectively, in FIGS. 6 and 7. The frequency of the switch-over between the states of the FIGS. 6 and 7 is denoted as $f_m$. Preferably, this frequency $f_m$ is chosen to be strictly below a frequency $\Gamma_c$. This frequency $\Gamma_c$ is the rate of relaxation of amplitude of the magnetoresistive device 40. This frequency $\Gamma_c$ represents the fact that the oscillator 22 does not instantaneously get synchronized with the frequency $f_t$. In other words, the oscillation included in the band $[f_t-\delta_t; f_t+\delta_t]$ must be present in the signal e(t) for a duration at least greater than $1/\Gamma_c$ so that the oscillator 22 has the time to get synchronized with this oscillation. It has been measured experimentally that the frequency $\Gamma_c$ ranges from 50 MHz to 50 GHz and typically from 100 MHz to 10 GHz. Thus, the maximum bit rate of information ranges from 50 Mbit/s to 10 or 50 Gbit/s.

The frequency $f_m$ is also chosen to be great enough to enable speedy detection of the synchronization of the oscillator 22. For example, the frequency $f_m$ is chosen to be greater than the inverse of the smallest duration $T_m$ of the oscillations of the band $[f_t-\delta t; f_t+\delta_t]$ which is to be detected.

At a step 126, the signal e(t) is received at the acquisition terminal 10. Its amplitude is then adjusted by the block 12 to produce the signal $I_{RF}(t)$ which is injected into the synchronization terminal 20 of the oscillator 22.

At a step 128, if oscillations at a frequency included in the band $[f_t-\delta_t; f_t+\delta_t]$ are present in the signal $I_{RF}(t)$ injected into the terminal 20, then the oscillator 22 gets synchronized. If not, the oscillator 22 does not get synchronized.

At a step 130, the comparator 28 receives the oscillating signal s(t) produced by the oscillator 22 at its terminal 26. From this oscillating signal s(t), it distinguishes a synchronized state from a non-synchronized state of the oscillator 22. It also indicates the presence of oscillations of a frequency $f_t$ only if a synchronized state of the oscillator 22 is identified.

More specifically, if the oscillator 22 is synchronized with the frequency $f_t$ in the state of FIG. 6, then the capacitor $C_2$ does not get charged or gets charged only very slowly since the power of the low-frequency noise is negligible. Then, the clock 108 causes the switches 92 and 94 to switch from the state represented in FIG. 6 to the state represented in FIG. 7. Since the capacitor $C_2$ is not charged, when it is connected to the control terminal 100, it cannot command the closing of the transistor 102. The potential at the output 29 is therefore floating, thus indicating the presence of oscillations at the frequency $f_t$ during the previous period.

Conversely, if the oscillator 22 is not synchronized, in the state shown in FIG. 6, the capacitor $C_2$ is quickly charged by the low-frequency noise. Then, when the clock 108 causes the switches 92 and 94 to switch over into the state of FIG. 7, the capacitor $C_2$ gets discharged into the control terminal 100.

This prompts the closing of the transistor 102. Consequently, the output 29 is at the potential $V_{cc}$ when no oscillation of a frequency $f_t$ has been detected for the preceding period of the clock 108.

The working of the capacitor $C_1$ and of the switch 94 can be deduced from what has been described here above for the switch 92 and the capacitor $C_2$. Thus, in this particular embodiment of the comparator 28, the presence of oscillations of frequency $f_t$ is expressed at the terminal 29 by the presence of a floating potential. Conversely, the absence of oscillations of frequency $f_t$ in the signal e(t) is expressed by the presence of a voltage $V_{cc}$ across the terminals 29 and 30.

Figure 9:
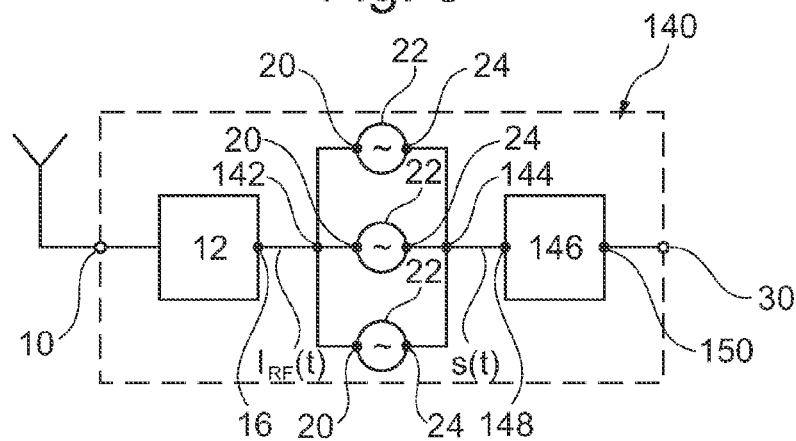
FIG. 9 is another embodiment of an detector of oscillations at the frequency $f_t$.

FIG. 9 shows a detector 140 of oscillations within the band $[f_t-\delta_t; f_t+\delta_t]$. This detector 140 is identical to the detector 2 except for the fact that:

the oscillator 22 is replaced by several oscillators 22 parallel-connected between a common synchronization terminal 142 and a common output electrode 144, and the comparator 28 is replaced by a comparator 146.

To simplify FIG. 9, only three parallel-connected oscillators are shown. The synchronization terminals 20 of each of these oscillators 22 are connected to the common terminal 142 which is itself directly connected to the output 16 of the block 12. The output electrodes 24 of each of the parallel-connected oscillators 22 are connected to the common output electrode 144 which is itself directly connected to an input terminal 148 of the comparator 146. An output terminal 150 of this comparator 146 is directly connected to the rendering terminal 30.

The parallel-connected oscillators 22 are all configured to get synchronized with the oscillators in the same frequency band $[f_t-\delta_t; f_t+\delta_t]$. Furthermore, when they are synchronized, they all oscillate at the same frequency $\alpha f_t$.

The oscillating signals produced by each of the oscillators 22 get superimposed on the electrode 144. When the oscillators 22 are synchronized with an oscillation whose frequency is included in the band $[f_t-\delta_t; f_t+\delta_t]$, they oscillate in phase. This means that the power of the signal s(t) produced at the terminal 144 is given by the following relationship $P_t=K^2 P \cos(f_t)$, where:

$P_t$ is the total power of the signal s(t) at the frequency $f_t$ produced at the electrode 144, K is the number of parallel-connected oscillators 22, and P is the power of the signal produced by each of these oscillators 22 at the frequency $f_t$.

Furthermore, the low-frequency noises of the oscillators 22 are generally not correlated. Thus, the superimposition of the signals of the oscillators 22 does not increase the low-frequency noise. The signal-to-noise ratio is therefore improved.

Conversely, when there is no oscillation in the band $[f_t-\delta_t; f_t+\delta_t]$ in the signal $I_{RF}(t)$, the oscillators 22 are not synchronized and oscillate, each at its free frequency $f_{lo}$. Thus, the parallel-connected oscillators 22 do not oscillate in phase. The power of the oscillating signals produced by each of the oscillators 22 does not add up at the electrode 144. Thus, when there is no synchronization on the oscillations of frequency $f_t$, the power of the signal s(t) at the frequency $f_t$ is very sharply below that which can be observed when the oscillators 22 are synchronized with the same oscillations. The term "very sharply below" herein indicates the fact that the power at the frequency $f_t$ of the signal s(t) when the oscillators 22 are synchronized is at least ten times greater than the power of this signal s(t) at the frequency $f_t$ when the oscillators 22 are not synchronized.

The comparator 146, like the comparator 28, distinguishes the synchronized state from the non-synchronized state of the oscillators 22. To this end, it uses the signal s(t) produced at the terminal 144. For example, in a first embodiment, the comparator 146 compares the envelope of the power spectrum around the frequency $f_t$ of the signal s(t) with a predetermined template. If the envelope is within this predetermined template, then it means that the oscillators 22 are synchronized and the comparator 146 in response indicates, at the terminal 150, the presence of oscillations in the band $[f_t-\delta_t; f_t+\delta_t]$ in the signal e(t). If not, if the envelope of the signal s(t) around the frequency $f_t$ does not come within the predetermined template, it means that the oscillators 22 are not in their synchronized states, and in response, the comparator 146 indicates, at the output 150, the absence of oscillations in the band $[f_t-\delta_t; f_t+\delta_t]$.

In another embodiment, the comparator 146 compares the power of the signal s(t) with a predetermined power threshold $S_1$. When the oscillators 22 are synchronized, the power of the signal s(t) goes beyond this threshold $S_1$. In response, the comparator 146 indicates, at its output 150, the presence of oscillations in the band $[f_t-\delta_t; f_t+\delta_t]$ in the signal e(t).

If not, if the threshold $S_1$ is not crossed, the comparator 146 indicates, at the output 150, the absence of oscillations in the band $[f_t-\delta_t; f_t+\delta_t]$.

Figure 10:
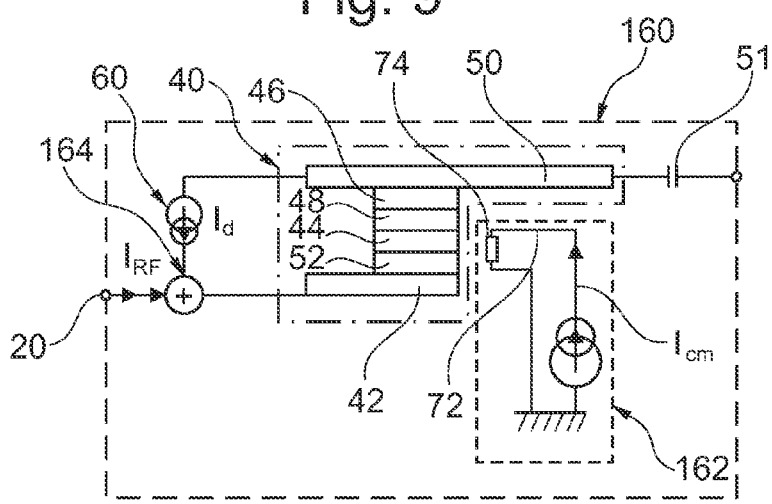
FIG. 10 is another embodiment of a radiofrequency oscillator that can be used in the detector of FIG. 1 or 9.

FIG. 10 shows an oscillator 160 capable of being used instead of the oscillator 22. This oscillator 160 is identical to the oscillator 22 except that the generator 70 is replaced by a generator 162 and the generator 60 is connected to the input electrode 42 by means of a summing element 164.

The generator 162 is identical to the generator 70 except that the summing element 80 is omitted. Thus, in this embodiment, the synchronization with the signal $I_{RF}(t)$ is not done by means of an alternating magnetic field. In this embodiment, the magnetic field $H_b$ is constant.

The summing element 164 possesses one input directly connected to the output of the direct current generator 60 and another input directly connected to the synchronization terminal 20. One output of this summing element 164 is directly connected to the electrode 42. Consequently, this summing element 164 adds the signal $I_{RF}(t)$ to the direct current $I_d$. Thus, when the oscillator 120 is used instead of the oscillator 22, the synchronization of the frequency of the oscillator with the frequencies $f_t$ is done by injecting the electrical signal $I_{RF}(t)$ into the electrode 42.

The working of the detector 2, when it is equipped with the oscillator 160, can be deduced from the explanations which have been given here above in the case of the oscillator 22. In particular, in order that the synchronization of the oscillator 160 with the frequency $f_t$ can occur, it is necessary to adjust the intensities of the currents $I_d$ and $I_{cm}$ as described here above. It is also necessary that the intensity of the current $I_{RF}(t)$ should not be negligible as compared with the intensity of the current $I_d$. To this end, the block 12 is set so that the intensity of the current $I_{RF}(t)$ is at least greater by 10% than the intensity of the current $I_d$. The intensity of the current $I_{RF}(t)$ is also chosen to be small enough so that the frequency or the frequencies $f_p$ with which it is not desired to get synchronized are outside the band $[f_t-\delta_t; f_t+\delta t]$.

Many other embodiments are possible. For example, the generator of the magnetic field $H_b$ can be distinct from the one which generates the field $H_a$.

It is not necessary for the free frequency $f_{lo}$ to be strictly equal to $\alpha f_t$. As a variant, the intensities of the currents $I_{cm}$ and $I_d$ are adjusted so that the frequency $f_{lo}$ is equal to the frequency $\alpha f_t$ to within plus or minus 60% or to within plus or minus 45% or 30% and preferably to within plus or minus 10 or 5%.

As a variant, $\alpha$ is different from one and strictly greater than one or 1,2. For example, it is chosen from the group formed by 2; 3/2; 5/2 and 3. α is equal to two in one embodiment that works particularly well.

Many other embodiments of the magnetoresistive device 40 are possible. For example, the direction of easier magnetization of the free layer and/or the reference layer are not necessarily contained in the plane of the layer. For example, the direction of easiest magnetization can be perpendicular to the plane of the layer.

It is also possible for the layer 44 to be a multilayer, for example an SyF (synthetic ferrimagnetic) or even an SAF (synthetic antiferromagnetic) multilayer. This makes it possible to trap the direction of magnetization of this layer without its being necessary to use a complementary anti-ferromagnetic layer for this. The layer 52 can therefore be omitted in this case.

The spacer 48 can be made out of an electrically conductive material such as copper (Cu). The magnetoresistive properties of the pillar are then called giant magnetoresistance or GMR properties.

One (or more) polarizers can also be used to make the magnetoresistive device in addition to the reference layer. A polarizer is a magnetic layer or multilayer, the magnetization of which is outside the plane of the layer and, for example, perpendicular to the plane of the layer. The polarizer makes it possible to spin-polarize the current that crosses it. Typically, the polarizer is formed by several sub-layers superimposed on one another, for example an alternation of magnetic and metallic layers (for example $(Co/Pt)_n$). Here, the polarizer is not described in greater detail. For further information on polarizers, reference may be made to the patent application FR2 817 998. The presence of the polarizer makes it possible to obtain a precession of the magnetization of the free layer outside its plane. This enables for example making the oscillator work in a null field, i.e. in the absence of any static external magnetic field. For example, a polarizer is directly deposited on the electrode 42. Thus, in the embodiment of FIG. 8, the magnetic field generator 122 can be omitted, for example, if a polarizer is used.

The magnetic field generator 70 can be made differently. For example, the magnetic field $H_b$ can be generated by a magnetized layer situated in proximity to the free layer.

The magnetic field $H_b$ can be parallel or perpendicular to the direction of easier magnetization of the free layer. It can also form any unspecified angle with this direction of easier magnetization. The choice of this angle modifies the possible values of the coefficient α.

Other embodiments of the comparator 28 or 146 are possible. In particular, the comparators 28 and 146 can be used, one instead of the other.

Outside the durations $T_m$ where the signal e(t) oscillates at a frequency included in the band $[f_r-\delta_r; f_r+\delta_r]$, the signal e(t) is such that it does not enable the synchronization of the radiofrequency oscillator. For example, outside the durations $T_m$, the signal e(t) does not oscillate or it has a waveform different from an oscillation at a pure frequency.

Other embodiments of the comparator are also possible. For example, the comparator can use the difference between the phases of the signals $I_{RF}(t)$ and s(t) to determine whether the radiofrequency oscillator is in the synchronized state or not.

The invention claimed is:

1. An apparatus comprising a detector of oscillations in a frequency band around a first frequency in a received radio-frequency electrical signal, said detector comprising an acquisition terminal for receiving said radio-frequency electrical signal, and a radio-frequency oscillator to be synchronized with said first frequency, said radio-frequency oscillator comprising at least one magnetoresistive device within which flows a spin-polarized electrical current for generating an oscillating signal at an output electrode, said at least one magnetoresistive device being formed by a stack of magnetic and non-magnetic layers, a synchronization terminal for synchronizing a frequency of said oscillating signal with a frequency of a signal received at said synchronization terminal, said synchronization terminal being connected to said acquisition terminal, and at least one of a current source to cause a continuous current of electrons to flow perpendicularly through said layers and a continuous magnetic field generator, said at least one said current and said continuous magnetic field being configured so that a free frequency of oscillations of an oscillating signal produced in absence of a signal at said synchronization terminal is, within ±60%, equal to said first frequency scaled by a positive rational number, an electronic comparator capable of automatically distinguishing a synchronized state of said radio-frequency oscillator from a non-synchronized state of said radio-frequency oscillator on the basis of an oscillating signal produced by said radio-frequency oscillator, said synchronized state being a state in which a power level of low-frequency components of said oscillating signal produced by said radio-frequency oscillator is below a predetermined power threshold, and said non-synchronized state being a state in which a power level of said low-frequency components of said oscillating signal produced by said radio-frequency oscillator is above said predetermined power threshold, said low-frequency components consisting of components having a frequency below 1 gigahertz, and indicating presence of oscillations in said frequency band around said frequency in said received radio-frequency electrical signal when said oscillator is in said synchronized state, and indicating absence of oscillations in said frequency band in said received radio-frequency electrical signal otherwise.

2. The apparatus of claim 1, wherein said electronic comparator is further configured to compare said power level of said low-frequency components of said oscillating signal produced by said radio-frequency oscillator with a predetermined power threshold, said low-frequency components consisting of components having a frequency below 1 gigahertz, and to indicate presence of oscillations in said frequency band around said first frequency in said received radio-frequency electrical signal if said power of said low-frequency components is below said predetermined threshold and, if not, to indicate absence of such oscillations in said received radio-frequency electrical signal.

3. The apparatus of claim 2, wherein the comparator further comprises a capacitor, a controllable switch, said controllable switch being switchable between a charged state in which said output electrode of said at least one radio-frequency oscillator is electrically connected to said capacitor, and a reading state in which said capacitor is connected to a device for indicating a charge thereof and said output electrode of said radio-frequency oscillator is electrically isolated from said capacitor, and a clock connected to said controllable switch to automatically control switching of said controllable switch between said charged state and said reading state.

4. The apparatus of claim 1, wherein said detector further comprises a common synchronization terminal configured to receive said radio-frequency electrical signal, a common output electrode, several magnetoresistive devices, each of which is configured to be synchronized with said first frequency, a synchronization terminal of each radio-frequency oscillator being connected to said common synchronization terminal to receive said received radio-frequency electrical signal, said output electrode of each radio-frequency oscillator being connected to said common output electrode so that oscillating signals produced by each of said radio-frequency oscillators are superimposed on said common output electrode, and wherein said comparator is further configured for distinguishing said synchronized state from said non-synchronized state based at least in part on an oscillating signal obtained at said common output electrode.

5. The apparatus of claim 1, wherein said each of said magnetoresistive devices comprises an input electrode by which a direct electrical current is injected, a reference layer for spin-polarizing said electrical current, said reference layer having a magnetization along a fixed direction, a free layer, having a magnetization that can oscillate when a spin-polarized current crosses said free layer, a non-magnetic spacer layer interposed between said reference layer and said free layer to form one of a tunnel junction and a spin valve, and an output electrode at which there is produced a signal oscillating at an oscillating frequency as a function of one of intensity of said direct current and amplitude of a continuous magnetic field having field lines that cross the free layer, wherein a cross-section of at least one layer in said stack has a diameter of less than 300 nanometers.

6. The apparatus of claim 5, wherein said radio-frequency oscillator comprises a magnetic field generator capable of generating a continuous magnetic field having field lines that cross said free layer with an intensity greater than or equal to 1 oersted.

7. A method for detecting oscillations in a frequency band around a first frequency in a received radio-frequency electrical signal, said method comprising receiving said radio-frequency signal at a synchronization terminal of a radio-frequency oscillator configured to be synchronized with said first frequency, said radio-frequency oscillator comprising a magnetoresistive device within which there flows a spin-polarized electrical current to generate an oscillating signal at an output electrode, said magnetoresistive device being formed by a stack of magnetic and non-magnetic layers, at least one of a current source to cause a continuous current of electrons to flow in said layers in a direction perpendicular to said layers and a continuous magnetic field generator, at least one of said continuous current of electrons and said continuous magnetic field being set so that a free frequency of oscillations of said oscillating signal produced in absence of a signal at said synchronization terminal is within ±60% of being equal to said first frequency scaled by a positive rational number, automatically distinguishing a synchronized state of said radio-frequency oscillator from a non-synchronized state of said radio-frequency oscillator based at least in part on an oscillating signal produced by said radio-frequency oscillator, said synchronized state being a state in which a power-level of low-frequency components of said oscillating signal produced by said radio-frequency oscillator is below a predetermined power threshold, and said non-synchronized state being a state in which a power-level of said low-frequency components of said oscillating signal produced by said radio-frequency oscillator is above said predetermined power threshold, said low-frequency components consisting of components having a frequency below 1 gigahertz, and indicating presence of oscillation in said frequency band around said first frequency in response to detection of said synchronized state and, alternatively, indicating absence of oscillation in said frequency band otherwise.

8. The method of claim 7, further comprising selecting said positive rational number from a group consisting of ½, ¾, 1, 3/2, 2, 5/2, 3, 7/2, and 4.

9. The method of claim 7, further comprising amplifying said received radio-frequency signal so that an extent of said band with which said radio-frequency oscillator can besynchronized includes said first frequency.

10. Method according to claim 7, further comprising amplifying said received radio-frequency signal such that an intensity of said signal at said synchronization terminal is at least one of greater than 10% of an intensity of said continuous current and corresponds to an alternating magnetic field greater than 1 oersted within said free layer when converted into a magnetic field by said continuous magnetic field generator.

* * * * *